United States Patent [19]

Gallagher, Sr.

[11] Patent Number: 4,842,137

[45] Date of Patent: Jun. 27, 1989

[54] HIGH DENSITY MAGAZINE FOR ELECTRICAL CONNECTORS

[75] Inventor: Robert E. Gallagher, Sr., Harrisburg, Pa.

[73] Assignee: AMP Incorporated, Harrisburg, Pa.

[21] Appl. No.: 238,953

[22] Filed: Aug. 31, 1988

[51] Int. Cl.⁴ .............................................. B65D 73/02
[52] U.S. Cl. .................................... 206/328; 206/564; 206/334; 206/332
[58] Field of Search ............... 206/328, 564, 334, 332, 206/563, 565

[56] References Cited

U.S. PATENT DOCUMENTS

| | | | |
|---|---|---|---|
| 4,236,635 | 12/1980 | Namiki | 206/564 |
| 4,478,337 | 10/1984 | Flum | 206/564 |
| 4,627,533 | 12/1986 | Pollard | 206/328 |
| 4,690,274 | 9/1987 | Luz | 206/328 |
| 4,736,841 | 4/1988 | Kaneko et al. | 206/328 |

Primary Examiner—Joseph Man-Fu Moy
Attorney, Agent, or Firm—Gerald K. Kita

[57] ABSTRACT

A high density magazine for electrical connectors and components. More particularly, the magazine is assembled from two outer members having inwardly facing cavities and a center member inbetween. Shoulders in the cavities cooperate with shoulders on each surface of the center member to provide supports for the electrical connectors or components on both sides of the center member.

10 Claims, 3 Drawing Sheets

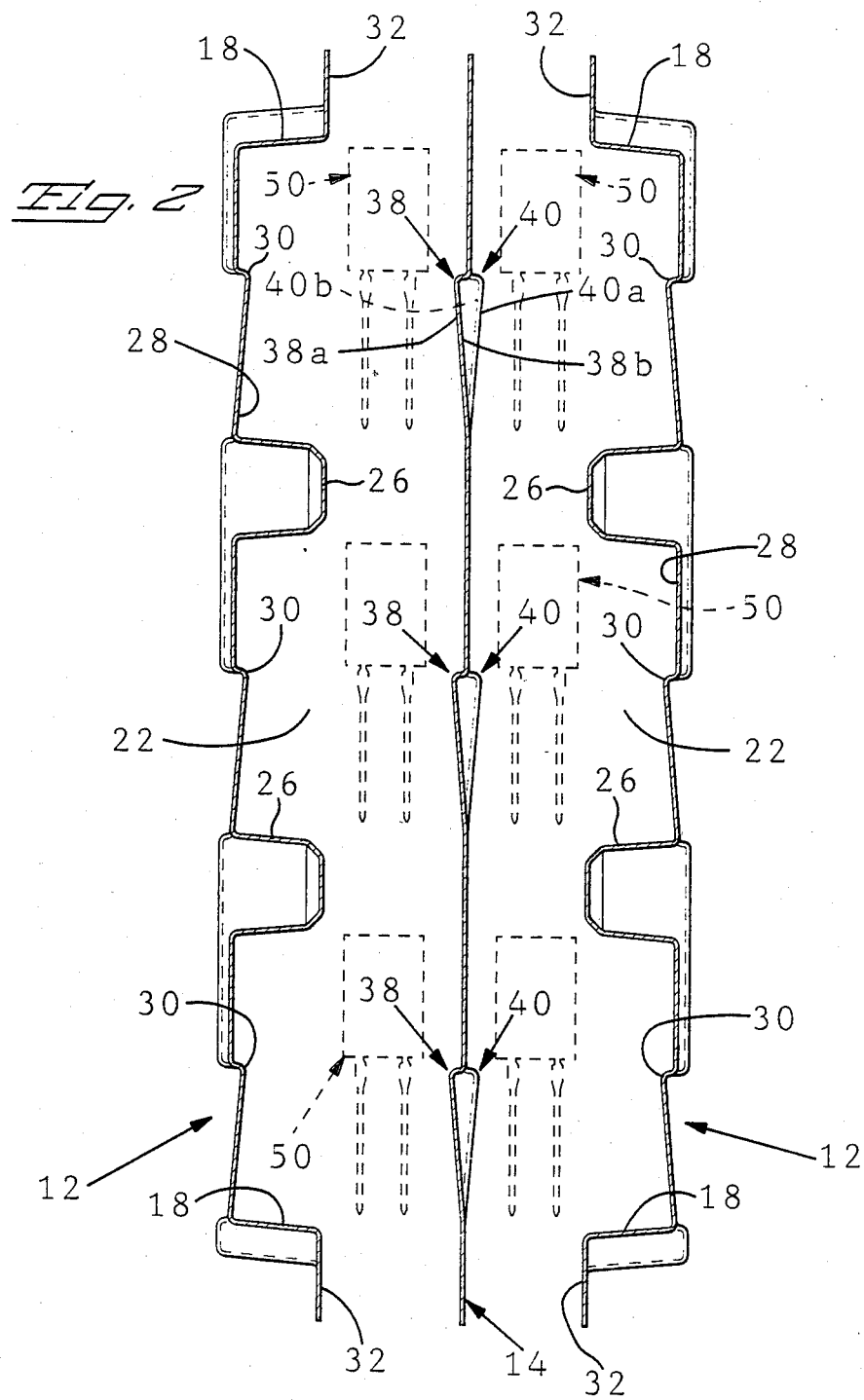

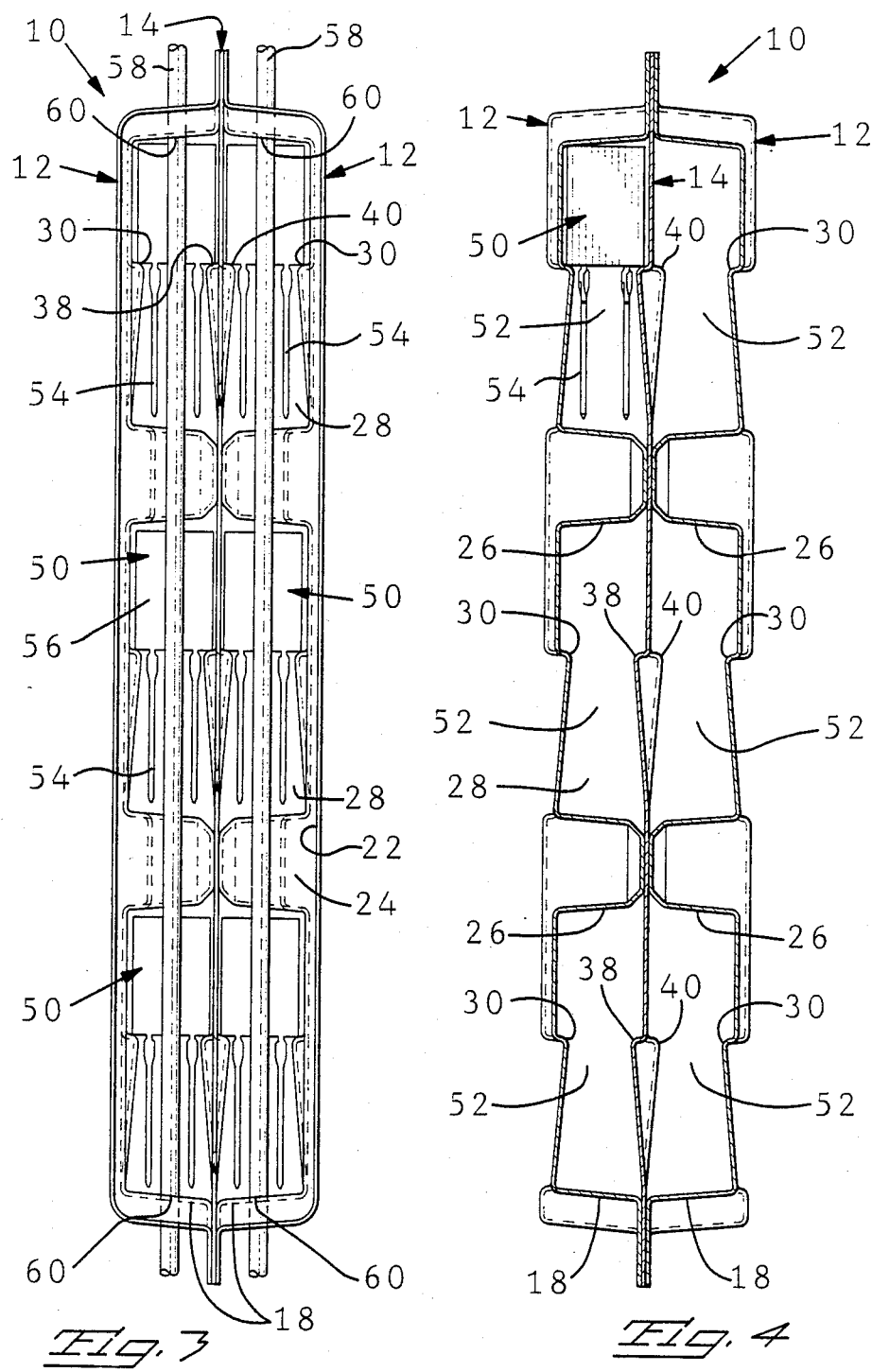

ial; e.g., PVC. The

HIGH DENSITY MAGAZINE FOR ELECTRICAL CONNECTORS

This invention relates to magazines for receiving, retaining and discharging electrical connectors for the type having contact leads extending outwardly from a surface thereof.

BACKGROUND OF THE INVENTION

Magazines and trays made of thin plastics material are now used predominantly to ship and handle electrical connectors and components. More recently, such magazines and trays have been adapted to be used with robotics equipment; e.g., in mounting electrical connectors onto printed circuit boards.

Known magazines, e.g., U.S. Pat. No. 3,184,056 to Kisor, and trays; e.g., U.S. Pat. No. 4,671,407 to Brutosky, have a single layer of one row: U.S. Pat. No. 4,515,269 to Hashimoto, or several parallel rows: U.S. Pat. No. 3,435,949 to Suverkropp. Such a construction; i.e., a single layer, has heretofore been the only structure available for electrical connectors having leads extending outwardly from one surface thereof. For these type connectors, shoulders are required to support the connectors so that the leads can extend into a space to prevent damage thereto and to permit the connectors to slide freely into and out of the row or rows. Multiple layers of connectors are provided by stacking discrete magazines and trays on top of each other. In an effort to improve upon this system and also to economize, one worker in the field, Brutosky, provided trays having downwardly extending skirts which provided an end cover for the underlying tray to confine the connectors during shipping and handling. The aforementioned U.S. Pat. No. 4,671,407 discloses this feature.

It is now proposed to provide a high density magazine having two layers with each layer having at least one row of connectors so that for a given width of a known magazine, the high density magazine will receive twice the number of electrical connectors.

SUMMARY OF THE INVENTION

According to the invention, a high density magazine for electrical connectors is provided by encasing a center member between two outer members wherein the center member is a single sheet of material having, on both surfaces and at the same distance from a given edge, a line of outwardly projecting, spaced apart segments defining a plurality of shoulders with the shoulders being normal to the surfaces and facing one edge. The shoulders on the surfaces of the center member cooperate with shoulders located in cavities in the outer members to provide support for the electrical connectors on both sides of the center member.

BRIEF DESCRIPTION OF THE DRAWINGS

FIG. 2 is an exploded, cross-sectional view of the magazine, taken inwardly from one end thereof;

FIG. 3 is a cross-sectional end view of the assembled magazine; and

FIG. 4 is a cross-sectional view of the assembled magazine taken inwardly from one end thereof.

DESCRIPTION OF THE INVENTION

Figure 1:
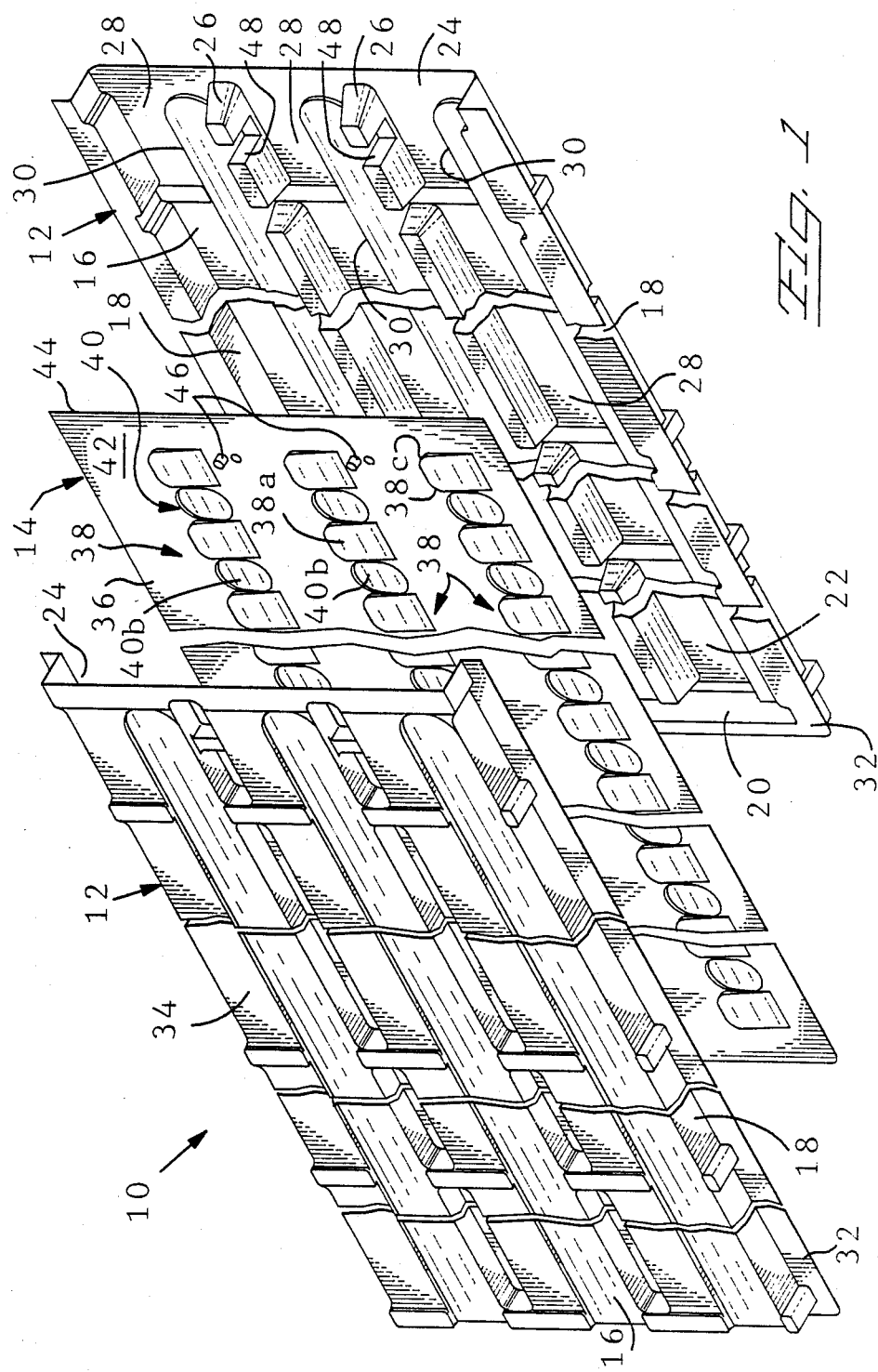
FIG. 1 is an exploded, perspective view of the magazine constructed in accordance with the present invention.

As shown in FIG. 1, magazine 10 includes two identical outer members 12 and a center member 14. Members 12 and 14 are made from a transparent plastics material; e.g., polyvinylchloride (PVC), having a thickness of about 0.020 inches (0.00508 mm). Members 12 and 14 made be formed using a number of manufacturing methods with vacuum forming being preferred.

Members 12 include base wall 16, side walls 18 and end wall 20, all of which cooperate to define cavity 22 having an open end 24. One or more partitions 26 (two are shown) extending outwardly from base wall 16 within cavity 22, are parallel to and define in cooperation with each other and with sidewalls 18, spaces 28. Shoulders 30 project out from base wall 16 into each space 28 and extend along most of the length of cavity 22 in parallel relation with partitions 26.

Flanges 32 extend laterally outwardly from the free edges of side and end walls 18,20 respectively.

Outer surfaces 34 of members 12 reversely reflect the structure described above by reason of the method of manufacture.

With reference to FIGS. 1 and 2, center member 14 is a single sheet 36 of plastics material; e.g., PVC. The parallel sets of shoulders 38 and 40 extend longitudinally across respective opposing surfaces 42,44. Shoulders 38 and 40 are defined by segments 38a and 40a respectively which extend obliquely outwardly from respective surfaces 42,44 of sheet 36. On surface 42, segments 38a alternate with depressions 40b; i.e., the reverse structure of segments 40a. Similarly, on surface 44, segments 40a alternate with depressions 38b; i.e., the reverse structure of segments 38a. Thus, shoulders 38,40 are located at the same spatial location on opposite surfaces 42,44 respectively as shown in FIG. 2.

Further included on surfaces 42,44 are outwardly projecting indexing studs 46 which enter gaps 48 in partitions 26 for alignment purposes during assembly of magazine 10.

Ends 38c of segments 38a are preferably rounded as shown.

FIG. 2 shows two members 12, one on each side of center member 14 and with cavities 22 facing inwardly. Connectors 50 which are to be loaded into an assembled magazine 10 are shown in phantom. As shown, side walls 18, partitions 26 and flanges 32 of each member 12 are positioned to meet with center member 14 therebetween. Further, shoulders 30 in each cavity 22 are on line with respective shoulders 38,40 on member 14.

FIGS. 3 and 4 are section views showing an assembled magazine 10. After outer members 12 are brought into position against center member 14, the engaging flanges 32 and partitions 26 are bonded together, preferably by R.F. welding. The resulting assembly in the illustrated magazine 10 provides six rows 52 for receiving, retaining and discharging connectors 50. As shown, each connector 50 rides on cooperating shoulders 30 and either shoulders 38 or shoulders 40 as the case might be. Contact leads 54 which extend outwardly from housing 56 of connectors 50 extend freely in spaces 28 so that connectors 50 slide freely on the cooperating shoulders 30,38,40.

FIG. 3 shows one method for retaining connectors 50 in rows 52 of magazine 10. A pair of rods 58 of any suitable material extend across open ends 24 of cavities 22 through holes 60 in sidewalls 18 and gaps 48 (FIG. 1) in partitions 26. Gaps 48 are preferable undersized so that rods 58 are snugly received therethrough. Rods 58 are supported by indexing studs 46.

To access connectors 50 in rows 52, rods 56 are simply pulled out.

Segments 38a defining shoulders 38 and segments 40a defining shoulders 40 are of a given length determined by the length of the connector 50 to be placed in connector 10. That is, the space between segments 38a and 40a cannot be so long that a connector 50 could not span the distance without one corner tipping in. As a general rule of thumb, the length preferably should not exceed about two-thirds the length of the connector 50.

As can be discerned, a high density magazine for electrical connectors and components has been disclosed. The magazine is formed from a single sheet comprising a center member and having on both surfaces one or more lines of spaced apart outwardly projecting segments defining shoulders which are normal to the surfaces. Outer members on each side of the center member having inwardly facing cavities with shoulders therein to cooperate with the shoulders on the center member to provide support for one or more rows of electrical connectors on both sides of the center member.

I claim:

1. A high density magazine for electrical connectors, comprising:
   a pair of identical outer members, each having a cavity defined by at least a base wall and opposing side walls and a longitudinally extending shoulder projecting outwardly from said base wall, said shoulder being parallel to, spaced from and facing one sidewall; and
   a sheet of material providing a center member having a size about equal to the length and width of said outer members and having a plurality of spaced apart segments extending towards opposite ends of said sheet and projecting outwardly from each surface, each segment defining a shoulder with said shoulders on each surface being normal thereto and at the same distance from and facing a given edge of said sheet, said magazine formed by joining the two outer members to opposite surfaces of the center member with the respective cavities facing the center member so that the shoulder in each cavity cooperates with a plurality of shoulders on a facing surface of the center member to thereby provide supports for electrical connectors on both sides of the center member.

2. The high density magazine according to claim 1 wherein each outer member includes within said cavity, a plurality of spaced, longitudinally extending shoulders and said center member includes a like plurality of shoulder-defining segments on each surface to cooperate with the plurality of shoulders in said outer members to provide a plurality of rows of electrical connector-receiving supports on both sides of the center member.

3. The high density magazine according to claim 2 further including outwardly projecting partitions located between each pair of spaced, longitudinally extending shoulders in the cavities to isolate said rows.

4. The high density magazine according to claim 1 further including an end wall at one end of each cavity and removable stop means at another end of each cavity to retain the electrical connectors within the magazine.

5. The high density magazine according to claim 2 further including an end wall at one end of each cavity and removable stop means at another end of each cavity to retain the electrical connectors within said rows.

6. The high density magazine according to claim 1 wherein said outer and center members are formed from thin plastics material.

7. The high density magazine according to claim 6 wherein the outwardly projecting segments on each surface of the center member are defined by depressions located between the segments on the opposite surfaces.

8. The high density magazine according to claim 7 wherein the length of the spaces between segments on the surfaces of the center member sheet is not more than two-thirds the length of the electrical connector to be received thereon.

9. The high density magazine according to claim 2 wherein said members are formed from thin plastics material and the outwardly projecting segments on each surface of the center member are defined by depressions located between the segments on the opposite surfaces.

10. The high density magazine according to claim 9 wherein the plastics material is not opaque and has a thickness of about 0.020 inches (0.00508 mm).

* * * * *